(12) United States Patent
Halleck

(10) Patent No.: US 6,496,915 B1
(45) Date of Patent: Dec. 17, 2002

(54) APPARATUS AND METHOD FOR REDUCING POWER CONSUMPTION IN AN ELECTRONIC DATA STORAGE SYSTEM

(75) Inventor: Michael D. Halleck, Northglenn, CO (US)

(73) Assignee: iLife Solutions, Inc., Dallas, TX (US)

( * ) Notice: Subject to any disclaimer, the term of this patent is extended or adjusted under 35 U.S.C. 154(b) by 0 days.

(21) Appl. No.: 09/476,590

(22) Filed: Dec. 31, 1999

(51) Int. Cl.[7] .............................................. G06F 13/00
(52) U.S. Cl. ..................... 711/171; 711/156; 711/158
(58) Field of Search ........................... 711/103, 170, 711/171, 156, 158; 365/229, 226, 145, 185.33, 227; 701/115; 713/300; 326/86

(56) References Cited

U.S. PATENT DOCUMENTS

| | | | |
|---|---|---|---|
| 5,645,068 A | 7/1997 | Mezack et al. | 128/670 |
| 5,708,615 A | 1/1998 | Ryoho et al. | 365/203 |
| 5,734,618 A | 3/1998 | Mizuta | 365/229 |
| 5,754,567 A | 5/1998 | Norman | 371/40.18 |
| 5,765,002 A | 6/1998 | Garnet et al. | 395/750.01 |
| 5,822,245 A | 10/1998 | Gupta et al. | 365/185.12 |
| 5,873,112 A | 2/1999 | Norman | 711/103 |
| 5,880,605 A * | 3/1999 | McManus | 326/86 |
| 5,903,508 A * | 5/1999 | Choi | 365/229 |
| 5,907,518 A * | 5/1999 | Shirley et al. | 365/226 |
| 5,969,981 A * | 10/1999 | Kono | 365/145 |
| 5,999,876 A * | 12/1999 | Irons et al. | 701/115 |
| 6,026,027 A * | 2/2000 | Terrell, II et al. | 365/185.33 |
| 6,052,789 A * | 4/2000 | Lin | 713/300 |
| 6,101,144 A * | 8/2000 | Jo | 365/229 |
| 6,145,069 A * | 11/2000 | Dye | 711/170 |
| 6,151,262 A * | 11/2000 | Haroun et al. | 365/227 |

* cited by examiner

Primary Examiner—David Hudspeth
Assistant Examiner—Fred F. Tzeng

(57) ABSTRACT

There is disclosed a system for minimizing a power consumption level of a memory data storage device that operates in a high power mode when data is being written therein and operates in a low power mode when inactive. The system comprises: 1) a controller for receiving incoming data to be written to the memory data storage device; and 2) a first low power buffer coupled to the controller. The controller stores the incoming data in the first low power buffer until a predetermined amount of incoming data has been accumulated in the first low power buffer and transfers the accumulated predetermined amount of incoming data to the memory data storage device in a single data transfer.

20 Claims, 4 Drawing Sheets

APPARATUS AND METHOD FOR REDUCING POWER CONSUMPTION IN AN ELECTRONIC DATA STORAGE SYSTEM

TECHNICAL FIELD OF THE INVENTION

The present invention is directed, in general, to electronic data storage technology and, more specifically, to an apparatus and method for providing a significant reduction in the power consumption of an electronic data storage system. The present invention is especially useful in providing a significant reduction in the power consumption of battery operated flash memory data storage systems.

BACKGROUND OF THE INVENTION

A non-volatile data storage device is one that retains the data stored in it when external power to the device is shut off. One of the earliest non-volatile storage devices was punched paper tape. One of the most recent technologies for storing data in a non-volatile electronic data storage device is called "flash memory." Flash memory is a programable semiconductor memory of a type called "read-mostly" memory. Flash memory is so named because of the speed with which it can be reprogrammed. Flash memory uses an electrical erasing technology that can erase an entire flash memory array in a few seconds at most. Data written to flash memory remains in a non-volatile storage mode until the flash memory is deliberately erased. Flash memory requires a relatively high level of current (and a high level of electrical power to provide that current) when data is being written to the flash memory. A typical value of current required by flash memory when data is being written to the flash memory is sixty milliamps (60 mA).

CompactFlash™ memory is a relatively new flash memory data storage system. CompactFlash™ is a registered trademark of SanDisk Corporation. CompactFlash™ memory is very useful in various types of technological applications and represents a significant advance over other flash memory data storage systems for a number of reasons. In comparison with other flash memory data storage systems, CompactFlash™ memory has greater speed, greater durability, and smaller size. It is also packaged in a form that is very compatible with personal computers, especially laptop computers. CompactFlash™ memory makes it possible to store several tens of Megabytes of data on a memory card that is no larger than an ordinary matchbook. CompactFlash™ memory cards are now being used in digital cameras, in personal data assistants (PDAs), in MP3 audio players, and in other similar electronic data storage devices.

One of the drawbacks of CompactFlash™ memory (and of flash memory data storage systems in general) is that its operation requires a relatively high level of current. The greater the speed with which a flash memory data storage system is accessed, the more current it requires for operation. Even at the slowest access speeds, flash memory data storage systems generally require a comparatively large amount of current for operation.

For this reason flash memory data storage systems have not been widely used in battery powered devices for gathering electronic data. This is especially true for battery powered devices that acquire data slowly over a relatively long period of time. The power requirements of a flash memory data storage system in such a device would require continual and frequent replacement of the batteries. In many applications this requirement would make the use of a flash memory data storage system impractical.

It would be advantageous to have a flash memory data storage system in which the power consumption is reduced compared to the power consumption in prior art flash memory data storage systems. It would also be advantageous that any reduction of the power consumption in such a flash memory data storage system be achieved without a corresponding reduction in the performance level of the flash memory data storage system.

SUMMARY OF THE INVENTION

To address the deficiencies of prior art electronic data storage systems, and especially those that require a relatively high level of current (and power) when data is being written to them, it is a primary object of the present invention to provide an improved electronic data storage system in which the power consumption of the electronic data storage system is reduced compared to the power consumption of prior art electronic data storage systems.

It is also an object of the present invention to provide an improved flash memory data storage system in which the power consumption of the flash memory data storage system is reduced compared to the power consumption in prior art flash memory data storage systems.

It is a further object of the present invention to provide an improved flash memory data storage system in which the reduction of the power consumption in the flash memory data storage system is achieved without a corresponding reduction in the performance level of the flash memory data storage system.

It is an additional object of the present invention to provide an improved flash memory data storage system for use in battery powered devices for gathering electronic data.

It is yet another object of the present invention to provide an improved flash memory data storage system for use in battery powered devices that acquire data slowly over a relatively long period of time.

Accordingly, in an advantageous embodiment of the present invention, there is provided, for use with a memory data storage device that operates in a high power mode when data is being written therein and operates in a low power mode when inactive, a system for minimizing a power consumption level of the memory data storage device comprising: 1) a controller capable of receiving incoming data to be written to the memory data storage device; and 2) a first low power buffer coupled to the controller, wherein the controller stores the incoming data in the first low power buffer until a predetermined amount of incoming data has been accumulated in the first low power buffer and wherein the controller transfers the accumulated predetermined amount of incoming data to the memory data storage device in a single data transfer.

In one embodiment of the present invention, the predetermined amount of incoming data is determined by a size of the predetermined amount of incoming data.

In another embodiment of the present invention, the size of the predetermined amount of incoming data is five hundred twelve bytes of data.

In still another embodiment of the present invention, the predetermined amount of incoming data is determined by a selected time duration during which the predetermined amount of incoming data has been accumulated.

In yet another embodiment of the present invention, the controller transfers the accumulated predetermined amount of incoming data to the memory data storage device when the memory data storage device is in the high power mode.

In a further embodiment of the present invention, the system further comprises a second low power buffer coupled to the controller capable of storing the incoming data when the accumulated predetermined amount of incoming data is being transferred from the first low power buffer to the memory data storage device.

In a still further embodiment of the present invention, the memory data storage device is of a battery powered type having a relatively high power consumption when data is written to the memory data storage device.

In a yet further embodiment of the present invention, the memory data storage device is a flash memory card.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in a suitably modified electronic data storage system.

Although the apparatus and method of the present invention can be utilized with any type of electronic data storage system, it is particularly useful in electronic data storage systems that require a relatively high level of current (and power) when data is being written to them. Although the present invention can be utilized with any type of electronic data storage system, the preferred embodiment of the present invention will be described in connection with a flash memory data storage system. The particular flash memory data storage system that will be described is known as CompactFlash™ memory.

Figure 1:
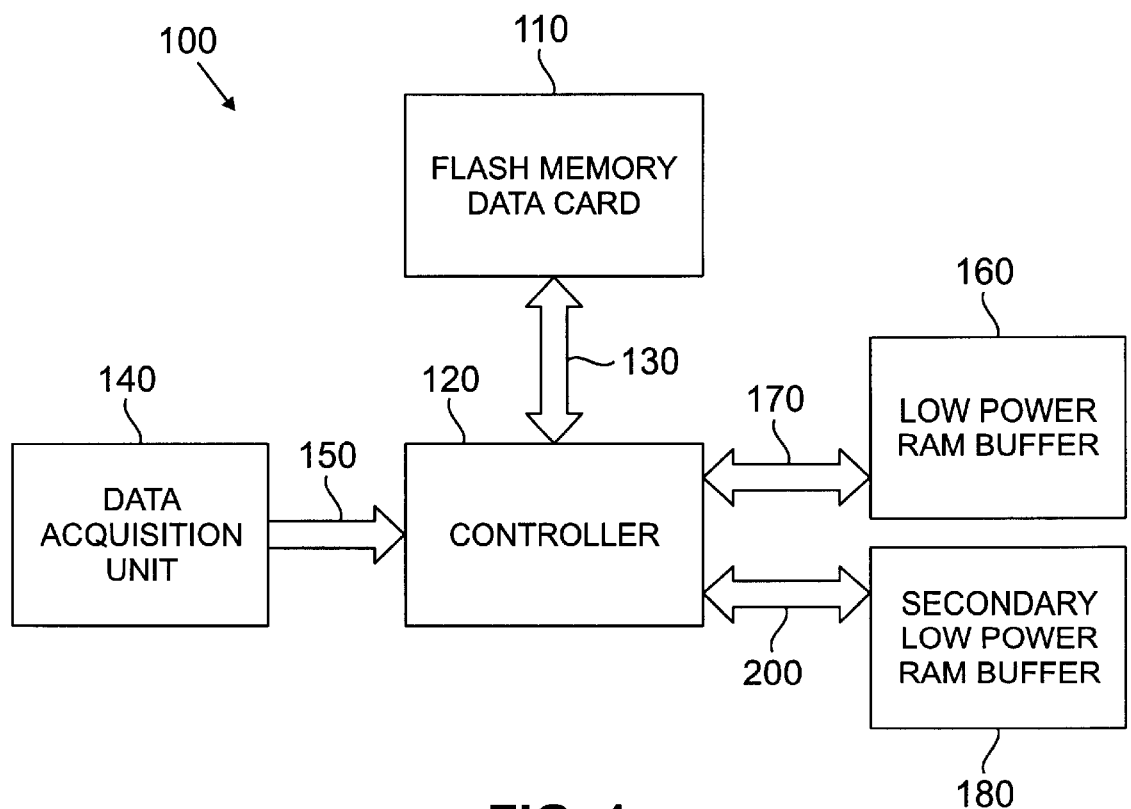
FIG. 1 is a block diagram showing the interconnection of the components of a flash memory data storage system utilizing the present invention.

FIG. 1 is a block diagram showing the interconnection of the components of flash memory data storage system 100 embodying the present invention. Flash memory data storage system 100 comprises flash memory data card 110. In an advantageous embodiment of the invention, flash memory data card 110 is a CompactFlash™ data card. However, other types of flash memory data cards 110 may be used. A battery (not shown) provides the power to operate the components of flash memory data storage system 100 and other circuitry associated with it.

Flash memory data card 110 is coupled to controller 120 through interface 130. Controller 120 is a data processing circuit that may read and write data to and from flash memory data card 110. Controller 120 is also coupled to data acquisition unit 140 through interface 150. Data acquisition unit 140 receives external data from one or more input devices (not shown) and sends the data to controller 120 for ultimate transfer to and storage in flash memory data card 110. Data acquisition unit 140 may be, for example, a multiplexer, an analog-to-digital converter (ADC), an input/output (I/O) data buffer, a digital data channel, or the like.

Controller 120 is also coupled to a low power RAM buffer 160 through interface 170. Low power RAM buffer 160 is used to temporarily store data from controller 120. As will be described in detail, low power RAM buffer 160 accumulates data from controller 120 and then sends the accumulated data through controller 120 to flash memory data card 110 under the control and direction of controller 120.

As previously mentioned, in an advantageous embodiment of the invention flash memory data card 110 is a CompactFlash™ data card, which is a non-volatile electronic data storage device that can store several tens of Megabytes of mass storage data. It is compatible with the PC Card ATA protocol and is also True IDE Mode compatible. It also is capable of a "low power"(or "sleep") mode of operation in which the data card temporarily ceases to use full power and draws only a relatively small amount of current. It also presently has one of the smallest form factors (i.e., module size) in the industry.

CompactFlash™ data cards are generally considered to be low power devices. This is certainly true when CompactFlash™ data card is compared to a mechanical hard disk drive. However, a CompactFlash™ data card may still have an unacceptably large power consumption when it is used in battery powered devices. This is especially so when the battery powered devices are designed to use small size batteries. When a CompactFlash™ data card is active, it uses sixty milliamps (60 mA) of current when data is being written. To supply this much current during a period of continuous operation of a CompactFlash™ data card, it would be necessary to provide the electrical power of approximately one (1) double-A (AA) alkaline battery per day. Therefore, to supply power to a battery powered flash memory data storage system for continuous data acquisition one would have to provide the electrical power of approximately seven (7) double-A (AA) alkaline batteries to operate the system for one (1) week.

As will be shown, flash memory data storage system 100 and the method of the present invention provides a significant power reduction for battery operated flash memory data storage systems. The power reduction provided by the present invention enables flash memory data card 110 described above to be continuously operated for more than eleven (11) days on just a single (i.e., only one) double-A (AA) alkaline battery. This represents more than a ten to one (10 to 1) improvement in the performance of flash memory data card 110 for the same level of power expended (i.e., one (1) double-A (AA) alkaline battery).

One may also express the improved performance in terms of power reduction. That is, for the same level of performance, the present invention requires approximately one tenth (0.10) of the power or approximately ten percent (10%) of the power that would otherwise be required in a prior art flash memory data storage system.

The power requirements of flash memory data card 110 are related to one of its most powerful and useful features, the ATA protocol interface. The ATA protocol interface allows a computer system (whether a personal computer, laptop, personal digital assistant (PDA), or the like) to treat flash memory data card 110 as if it were a mechanical hard disk drive. That is, the ATA protocol interface of flash memory data card 110 allows it to emulate a mechanical hard disk drive. To install flash memory data card 110 into a computer, the user simply inserts flash memory data card 110 into the PCMCIA slot in the computer (using, for example, a CompactFlash™ to PCMCIA adapter). Then the user can access data on flash memory data card 110 as easily as accessing the local hard disk drive of the computer.

Unfortunately, the ATA protocol interface imposes some restrictions in the interface that make the slow acquisition of data expensive in terms of power consumption. The primary restriction is the requirement that data be written to flash memory data card 110 in blocks of five hundred twelve (512) bytes at a time. That is, data cannot be written to flash memory data card 110 in increments of less than 512 bytes. Flash memory data card 110 must remain in high power mode for the entire time that the 512 bytes are being sent. Flash memory data card 110 can enter its low power (or sleep) mode of operation only after an entire 512 byte block has been received.

A result of this feature is that a flash memory data card 110 that does not employ the apparatus and method of the present invention spends a relatively large amount of time in full power mode waiting for data, particularly if data is received slowly.

Figure 2:
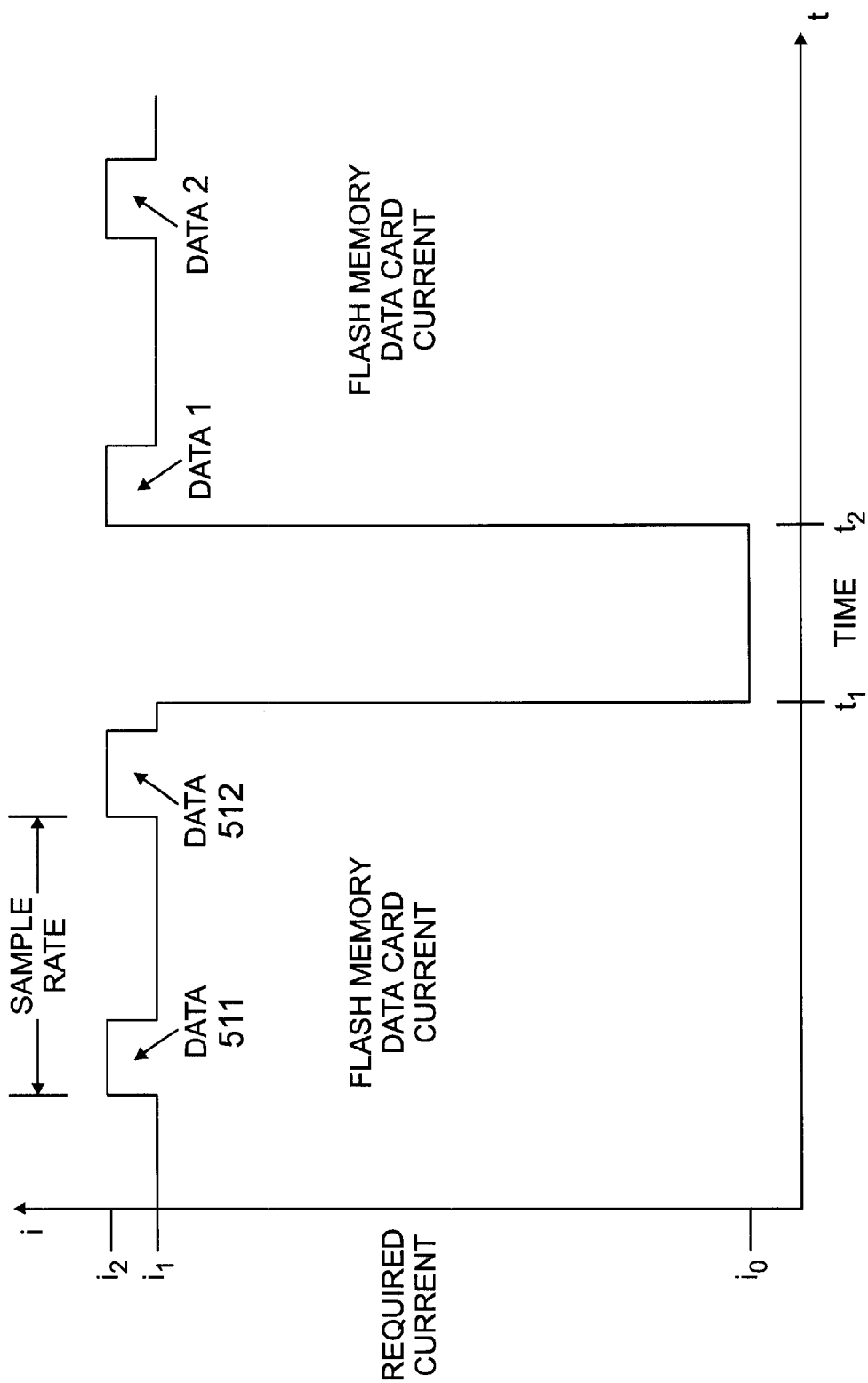
FIG. 2 is a data timing diagram showing the current required by a flash memory data card during a typical sequence for acquiring and writing data in a flash memory data card not utilizing the present invention.

This may be seen by referring to FIG. 2. FIG. 2 is a data timing diagram showing the current required by flash memory data card 110 during a typical sequence in which data is slowly acquired and written to flash memory data card 110. Flash memory data card 110 draws full power during the entire time that it is waiting for the 512 bytes of data. This power level is represented in FIG. 2 by a current having a value of $i_1$. When a byte of data, such as data byte 511 or data byte 512 is being written to flash memory data card 110, a little extra power is required for a short time. This is represented in FIG. 2 by a current level having a value of $i_2$. Between the acquisition of each of the individual bytes of data, flash memory data card 110 draws a current with a value of $i_1$. As flash memory data card 110 receives a block of data one byte at a time, from Byte 1 up to Byte 512, the required current fluctuates between the values of $i_1$ and $i_2$.

As shown in FIG. 2, the sample rate time is the length of time from the beginning of one byte of data to the beginning of the next byte of data. The sample rate time may be relatively long compared to the length of time it takes to acquire one byte of data. Flash memory data card 110 must continue to wait during the entire sample rate time during data acquisition. In doing so, flash memory data card 110 continues to draw full power even though it is effectively doing nothing but waiting for data.

After flash memory data card 110 has received and written the last byte in a block of data (i.e., the $512^{th}$ byte), flash memory data card 110 stores the block of data and goes into its low power mode of operation. This happens at time $t_1$ as shown in FIG. 2. In the low power mode of operation, flash memory data card 110 draws a very small amount of current. This low power level is represented in FIG. 2 by a very small amount of current having a value of $i_0$.

A As soon as the next data is written, flash memory data card 110 again begins to draw full power. This happens at time $t_2$ as shown in FIG. 2. The time that flash memory data card 110 is in low power mode is equal to the time $t_2$ minus the time $t_1$, a time that is less than the sample rate time. Therefore, flash memory data card 110 is in low power mode only during every $512^{th}$ sample. This equates to two tenths percent (0.2%) of the time. Flash memory data card 110 draws full power ninety nine and eight tenths percent (99.8%) of the time.

In order to conserve power, the present invention utilizes low power RAM buffer 160. As controller 120 receives data from data acquisition unit 140 through interface 150, controller 120 writes the data to low power RAM buffer 160 through interface 170, instead of writing the data to flash memory data card 110. While low power RAM buffer 160 is accumulating the data, flash memory data card 110 is in its low power mode of operation. After the low power RAM buffer 160 has accumulated one 512-byte block of data, controller 120 causes flash memory data card 110 to terminate low power (or sleep) mode and to return to full power mode to receive the data. Controller 120 then transfers the 512-byte data block from low power RAM buffer 160 to flash memory data card 110. This method ensures that flash memory data card 110 is only in its high power mode during the time that the accumulated block of data is being transferred from low power RAM buffer 160 to flash memory data card 110.

Figure 3:
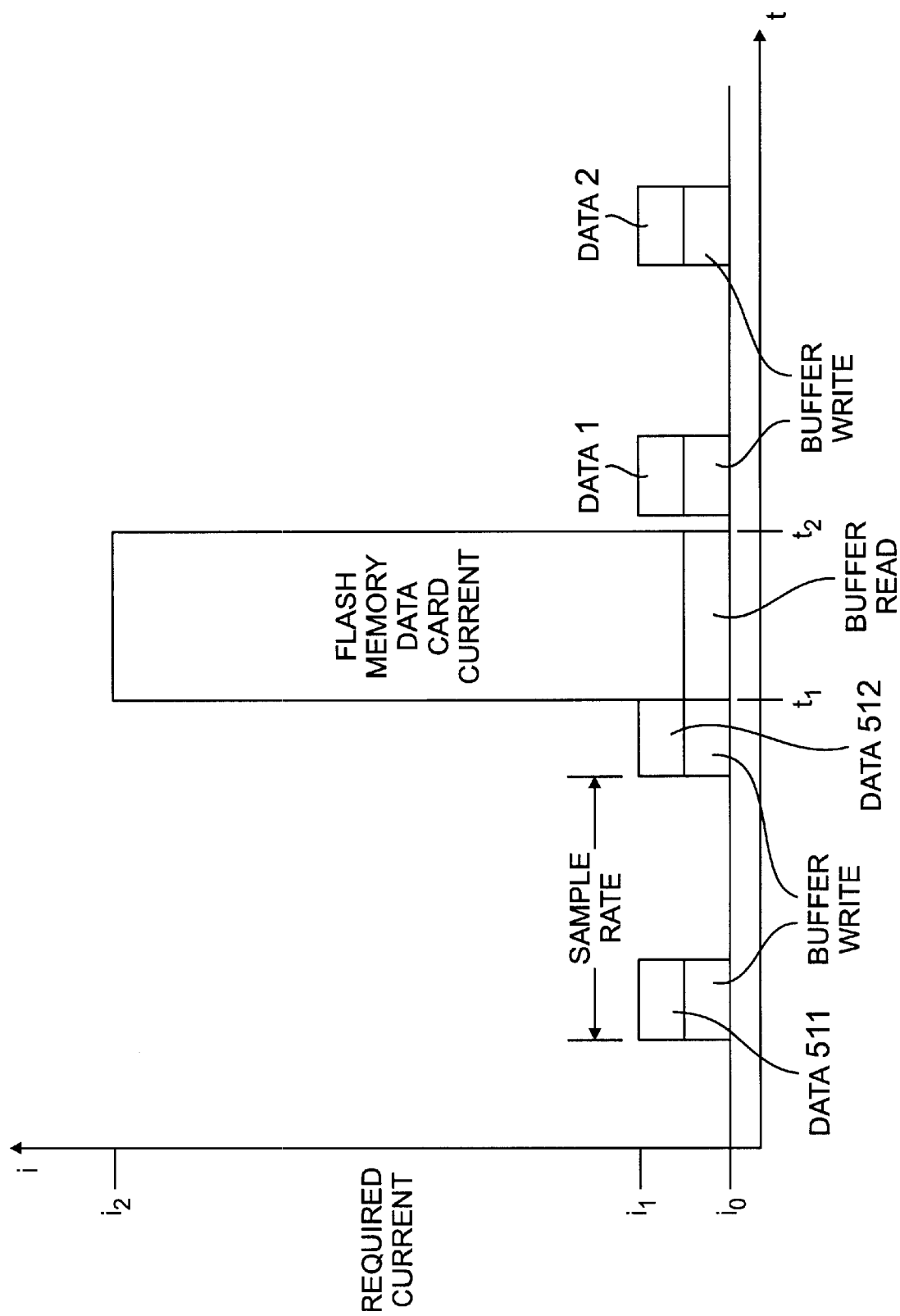
FIG. 3 is a data timing diagram showing the current required by a flash memory data card during a typical sequence for acquiring and writing data in a flash memory data card that utilizes the present invention.

The present invention enables flash memory data card 110 to spend a relatively short amount of time in full power mode while it is receiving data. This may be seen by referring to FIG. 3. FIG. 3 is a data timing diagram showing the current required by flash memory data card 110 during a typical sequence for acquiring and writing data in accordance with the apparatus and method of the present invention. Flash memory data card 110 draws full power only during the time that it is receiving data from low power RAM buffer 160. This power level is represented in FIG. 3 by a current having a value of $i_2$. While flash memory data card 110 is waiting for low power RAM buffer 160 to accumulate a block of data, flash memory data card 110 is in low power mode of operation. As previously mentioned, in the low power operation, flash memory data card 110 draws a very small amount of current. This very small amount of current is part of the quiescent system current that is represented in FIG. 3 by a current having a value of $i_0$.

The amount of current required for flash memory data storage system 100 to acquire and write one byte of data in low power RAM buffer 160 is represented in FIG. 3 by a current having a value of $i_1$. Between the individual acquisition of each of the individual bytes of data, flash memory data storage system 100 draws a current with a value of $i_0$, the quiescent system current. As low power RAM buffer 160 receives a block of data one byte at a time, from Byte 1 up to Byte 512, the required current fluctuates between the values of $i_0$ and $i_1$.

Because flash memory data card 110 is in low power mode while low power RAM buffer 160 is acquiring a block of 512 bytes of data, a relatively long sample rate time has no negative effect on the amount of current required to operate flash memory data storage system 100. In the previously described prior art embodiment, the operating current was at an increased level during the entire sample rate time, however long the sample rate time happened to be.

After low power RAM buffer 160 has received and written in its buffer the last byte in a block of data (i.e., the $512^{th}$ byte), controller 120 causes flash memory data card 110 to exit low power mode and transfers the block of data from low power RAM buffer 160 to flash memory data card 110. This happens at time $t_1$ as shown in FIG. 3. In this active mode of operation, flash memory data card 110 draws a relatively large amount of current. This high power level is represented in FIG. 3 by a current having a value of $i_2$.

After flash memory data card 110 has read and stored all of the block of 512 bytes of data, controller 120 causes flash memory data card 110 to return to low power mode. This happens at time $t_2$ as shown in FIG. 3. The time that flash memory data card 110 is at its full power level is equal to the time $t_2$ minus the time $t_1$. If the sample rate is sufficiently slow (i.e., if the time between the samples is sufficiently long) the situation will be that as shown in FIG. 3. In FIG. 3 flash memory data card 110 has received all of the block of 512 bytes of data from low power RAM buffer 160 and has returned to low power mode before the arrival of Byte 1 of the next block of data. In this situation, flash memory data card 110 is in low power mode during 551 out of every 512 samples. This equates to ninety nine and eight tenths percent (99.8%) of the time. Flash memory data card 110 is drawing full power only during two tenths of a percent (0.2%) of the time. This represents a complete reversal of the situation that existed in the case of the previously described prior art embodiment.

It takes a fixed amount of time to transfer the accumulated block of data out of low power RAM buffer 160 to flash memory data card 110. In cases where the sample rate is sufficiently fast (i.e., where the time between the samples is sufficiently short) it will be necessary for flash memory data storage system 100 to continue to acquire data during the time of the data transfer from low power RAM buffer 160 to flash memory data card 110.

To meet this requirement secondary low power RAM buffer 180 is coupled to controller 120 through interface 200 to acquire the data from data acquisition unit 140 that is being transferred through interface 150 to controller 120 during the time that the previously accumulated block of 512 bytes of data is being transferred from low power RAM buffer 160 to flash memory data card 110. After low power RAM buffer 160 has completed the task of transferring the most recently accumulated block of data to flash memory data card 110, the contents of secondary low power RAM buffer 180 are transferred through interface 200 and through controller 120 and through interface 170 to low power RAM buffer 160. The data collection then continues in accordance with its normal operation. Low power RAM buffer 160 may sometimes be referred to as the "primary" low power RAM buffer 160 to distinguish it from secondary low power RAM buffer 180.

It is possible that controller 120 may receive data from data acquisition unit 140 during the time that secondary low power RAM buffer 180 is transferring data to primary low power RAM buffer 160. If this happens controller 120 interrupts the transfer and stores the data in secondary low power RAM buffer 180. Controller 120 then causes the transfer to resume. This process may repeated if necessary. When the transfer is completed controller 120 causes the stored data to be transferred to low power RAM buffer 160 in its sequential order.

The storage capacity of secondary low power RAM buffer 180 must be large enough to hold all data that is acquired from controller 120 during the time that primary low power RAM buffer 160 is transferring the most recently accumulated block of data to flash memory data card 110. The storage capacity that will be needed by secondary low power RAM buffer 180 for most applications will typically be less than the storage capacity of primary low power RAM buffer 160. However, the storage capacity of secondary low power RAM buffer 180 may be larger than the storage capacity of primary low power RAM buffer if so required for a particular application.

Controller 120 handles all the interface/bus timing signals between flash memory data card 110 and low power RAM buffer 160 and secondary low power RAM buffer 180 and data acquisition unit 140. Controller 120 may be implemented as a microprocessor or a programmable logic device or a similar type of electronic control circuit.

If controller 120 is a microprocessor, low power RAM buffer 160 and secondary low power RAM buffer 180 may be subcomponents of the microprocessor. For ATA protocol interface applications a minimum storage capacity of five hundred twelve (512) bytes is required for low power RAM buffer 160. For other types of applications the minimum storage capacity of low power RAM buffer 160 may be greater than or less than five hundred twelve (512) bytes of data. Low power RAM buffer 160 is capable of rapidly transferring an accumulated block of data to flash memory data card 110 through controller 120. For this reason secondary low power RAM buffer 180 will not normally need to have a storage capacity as large at that of low power RAM buffer 160. But in the interest of having adequate storage capacity, it is recommended that secondary low power RAM buffer 180 also have at least the same storage capacity as primary low power RAM buffer 160. In ATA protocol interface applications this is at least five hundred twelve (512) bytes of storage. Both low power RAM buffer 160 and secondary low power RAM buffer 180 may be volatile memory.

The ATA protocol interface requires that data be written to flash memory data card 110 in blocks of five hundred twelve (512) bytes at a time. It is clear, however, that the present invention is not limited to the ATA protocol interface. The present invention is capable of operating on data blocks that are smaller or larger than 512 bytes in size. In an alternate embodiment of the invention capable of operating on a data block larger than 512 bytes, the size of the storage capacity of low power RAM buffer 160 and secondary low power RAM buffer 180 are selected to contain at least the largest data block to be transferred.

In another alternate embodiment of the present invention, controller 120 stores incoming data in low power RAM buffer 160 for a selected period of time. The predetermined amount of incoming data is chosen to be the data that arrives within that selected period of time. With an internal clock (not shown) controller 120 records how much time has elapsed since the beginning of the selected period of time. When the selected period of time has ended, all data received by controller 120 and stored in low power RAM buffer 160 is transferred to flash memory data card 110. This also includes instances where no data was received during the selected period of time.

Figure 4:
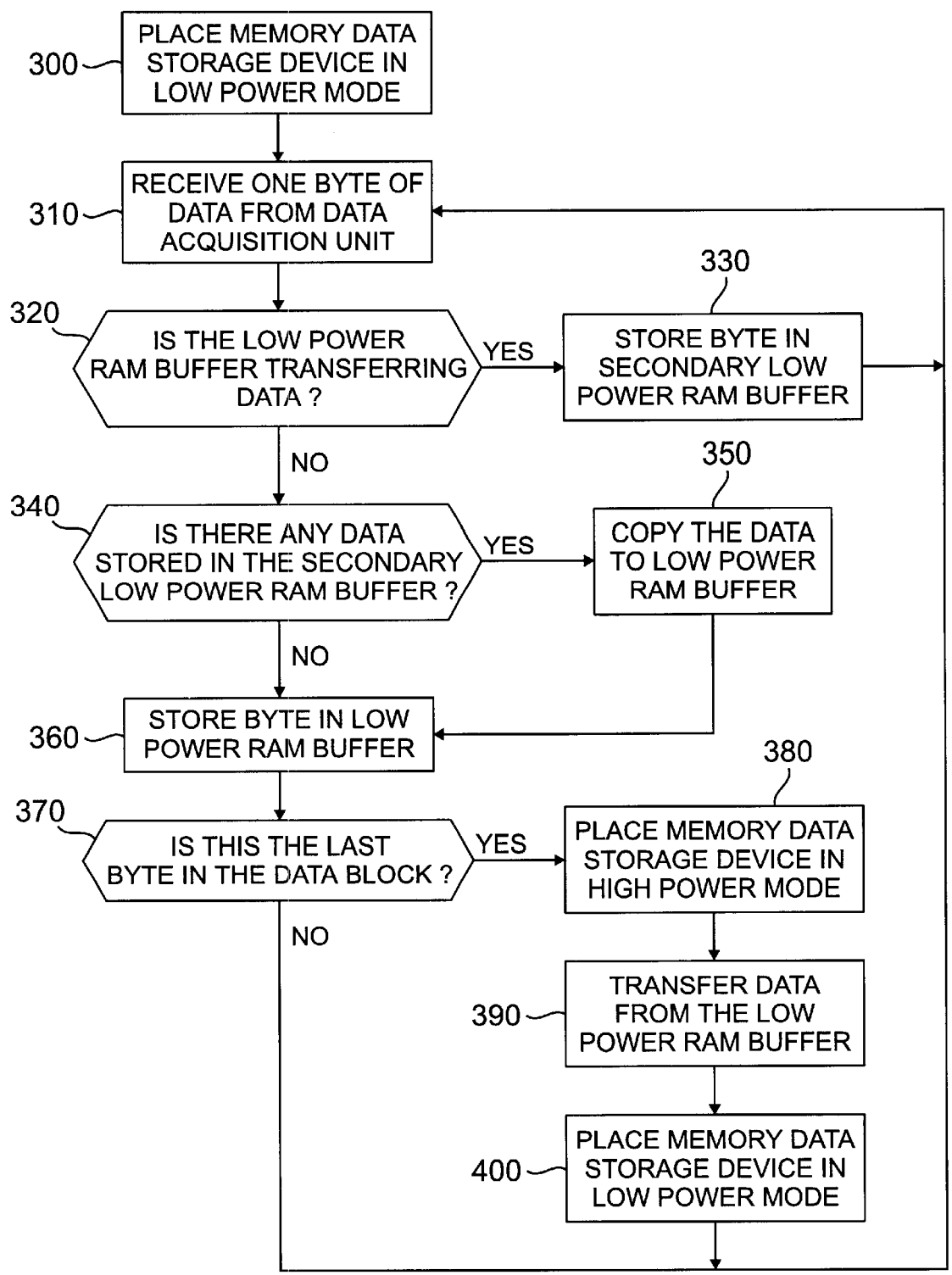
FIG. 4 is a flow diagram illustrating the logic of the operation of the apparatus of the present invention.

FIG. 4 is a flow diagram illustrating the operation of flash memory data storage system 100 according to one embodiment of the present invention. In operation step 300 controller 120 places memory data storage device 110 (e.g., flash memory data card 110) in a low power mode. In operation step 310 controller 120 receives one byte of data from data acquisition unit 410. In decision step 320 a determination is made whether low power RAM buffer 160 is transferring data to memory data storage device 110. If it is, then controller 120 stores the byte of data in secondary low power RAM buffer 180 in operation step 330 and waits to receive the next byte of data in operation step 310.

If low power RAM buffer 160 is not transferring data to memory data storage device 110, then a determination is made in decision step 340 whether there is any data stored in secondary low power RAM buffer 180. If there is, controller 120 in operation step 350 copies the data from secondary low power RAM buffer 180 to low power RAM buffer 160. In operation step 360, controller 120 stores the byte of data in low power RAM buffer 160. If there is no data in secondary low power RAM buffer 180, then controller 120 goes directly from decision step 340 to operation step 360.

In decision step 370 a determination is made whether the byte of data is the last byte in the data block. If it is not, then controller 120 waits to receive the next byte of data in operation step 310. If the byte of data is the last byte of data in the data block, then controller 120 in operation step 380 places memory data storage device 110 in high power mode, and in operation step 390 transfers all of the bytes of data in the data block from low power RAM buffer 160 to memory data storage device 110. After all of the bytes of data in the data block have been transferred to memory data storage device 110, controller 120 in operation step 400 places the memory data storage device 110 in low power mode and waits to receive the next byte of data in operation step 310.

Because controller 120 is receiving the bytes of data in operation step 310 at a particular data rate, it is possible that controller 120 will receive one or more bytes of data while operation step 390 is in progress. The bytes of data that are received while operation step 390 is in progress are stored in the secondary low power RAM buffer 180 as indicated in operation step 330 until operation step 390 is completed.

The improvement that the present invention provides can be illustrated by comparing the value of the average current required to write one block of 512 bytes of data using the prior art flash memory data storage system with the value of the average current required to write the same size block of data utilizing the flash memory data storage system of the present invention. Table 1 shows results obtained using a prior art flash memory data storage system at a sample frequency of 400 Hz. Table 2 shows the results obtained using a flash memory data storage system of the present invention at the sample frequency of 400 Hz.

TABLE 1

| Prior Art Flash Memory System | Active Current (mA) | Inactive Current (mA) | Active Time (msec) | Inactive Time (msec) | Average Current (mA) |
|---|---|---|---|---|---|
| Write Data to CompactFlash ™ Data Card | 45 | 0.02 | 1277.5 | 0.5 | 44.91 |
| Read Analog Data | 1.18 | 0.01 | 0.036 | 2.5 | 0.027 |
| Quiescent System power | | | | | 0.5 |
| TOTALS | | | | | 45.43 |

TABLE 2

| Invention Flash Memory System | Active Current (mA) | Inactive Current (mA) | Active Time (msec) | Inactive Time (msec) | Average Current (mA) |
|---|---|---|---|---|---|
| Read from RAM Buffer and Write to CompactFlash ™ Data Card | 70 | 0.02 | 30 | 1280 | 1.66 |
| Read Analog Data | 1.18 | 0.01 | 0.036 | 2.5 | 0.027 |
| Write Data to RAM Buffer | 25 | 0.1 | 0.04 | 2.5 | 0.5 |
| Quiescent System Power | | | | | 0.5 |
| TOTALS | | | | | 2.68 |

A comparison of Table 1 and Table 2 shows that while the prior art flash memory data storage system consumes an average current of 45.43 mA during the time required to read 512 byte data block, the flash memory data storage system of the present invention consumes only an average current of 2.68 mA to do the same task. The flash memory data storage system of the present invention provided a 94% reduction in the average current required to write a 512 byte data block. This percentage is calculated as follows:

$$\text{Percentage } (\%) = \frac{(45.43 \text{ mA} - 2.68 \text{ mA})}{45.43 \text{ mA}} \times (100\%)$$

Table 3 sets forth a comparison showing how much longer certain types of batteries can operate using the flash memory data storage system of the present invention than those same batteries can operate using the prior art flash memory data storage system.

TABLE 3

| Battery | Capacity (mA Hours) | Battery Life Prior Art (days) | Battery Life Invention (days) |
|---|---|---|---|
| Two double A (2 AA) | 2100 | 1.92 | 32.6 |
| One double A (1 AA) | 840 | 0.77 | 13.1 |
| Lithium (CareTech) | 781 | 0.72 | 12.14 |
| Lithium (D12450) | 550 | 0.50 | 8.55 |

The information tabulated in Table 3 illustrates the magnitude of the improvement in battery life that the present invention provides. Although the capacity of each battery (expressed in milliamp-hours) is the same in both flash memory data storage systems, the battery life of each battery is significantly longer when the battery is utilized in the flash memory data storage system of the present invention. This is because the flash memory data storage system of the present invention utilizes battery power in a much more economic manner during the acquisition and recording of electronic data.

These results demonstrate that the present invention has achieved its object of providing an improved electronic data storage system in which the power consumption of the electronic data storage system is reduced compared to the power consumption of prior art electronic data storage systems.

The present invention is capable of providing improvement in the performance of battery type power supplies that are capable of being recharged. For example, rechargeable batteries that are connected to solar cells may be recharged by electrical current that is provided by the solar cells. Such devices may be used to power a data storage system. The present invention is capable of reducing the power consumption in those types of systems in the manner previously described.

The present invention may be utilized in a number of different types of electronic data storage systems. For example, the present invention may be utilized in a computer system such as a personal computer, laptop computer, personal digital assistant (PDA), MP3 audio player, etc. Memory data storage device 110 may be a computer hard disk with which the present invention interfaces directly through interface 130. The present invention can similarly interface directly with any type of electronic data storage device that utilizes the PC Card ATA protocol. The present invention can also interface directly with devices that use a protocol in which the data blocks to be transferred are larger than 512 bytes or are smaller than 512 bytes. The present invention may also be utilized in wireless messaging devices such as cellular telephones, pagers, wireless devices for receiving Internet service, etc.

The present invention may also be utilized in smart appliances. Smart appliances are electric and/or electronic appliances that possess computerized electronic circuitry for monitoring and controlling the operation of the appliance. The present invention may also be utilized in industrial electronic control circuitry including circuitry that is used in the construction and operation of robots and robotic machines.

The present invention may also be utilized in instrument recorders such as flight data recorders in aircraft. Flight data recorders use so much power that they have to be driven by the main power buses of an aircraft. The present invention makes practical the use of battery power to power flight data recorders in an aircraft where main power has been lost in the final moments of an aircraft crash.

The present invention may also be utilized in instrument recorders used in geophysical exploration in remote locations. Such instrument recorders include, without limitation, recorders for recording weather information and for recording ocean currents and ocean temperatures.

The present invention may be used in any type of instrument recorder that records data in any location where an abundant supply of electrical power is not readily available.

Although the present invention has been described in detail, those skilled in the art should understand that they can make various changes, substitutions and alterations herein without departing from the spirit and scope of the invention in its broadest form.

What is claimed is:

1. For use with a memory data storage device that operates in a high power mode when data is being written therein and operates in a low power mode when inactive, a system for minimizing a power consumption level of said memory data storage device comprising:
    a controller capable of receiving incoming data to be written to said memory data storage device; and
    a first low power buffer coupled to said controller, wherein said controller stores said incoming data in said first low power buffer until a predetermined amount of incoming data has been accumulated in said first low power buffer and wherein said controller transfers said accumulated predetermined amount of incoming data to said memory data storage device in a single data transfer.

2. The system as set forth in claim 1 wherein said predetermined amount of incoming data is determined by a size of said predetermined amount of incoming data.

3. The system as set forth in claim 2 wherein said size of said predetermined amount of incoming data is five hundred twelve bytes of data.

4. The system as set forth in claim 1 wherein said predetermined amount of incoming data is determined by a selected time duration during which said incoming data has been accumulated.

5. The system as set forth in claim 1 wherein said controller transfers said accumulated predetermined amount of incoming data to said memory data storage device when said memory data storage device is in said high power mode.

6. The system as set forth in claim 1 further comprising a second low power buffer coupled to said controller capable of storing said incoming data when said accumulated predetermined amount of incoming data is being transferred from said first low power buffer to said memory data storage device.

7. The system as set forth in claim 1 wherein said memory data storage device is of a battery powered type having a relatively high power consumption when data is written to said memory data storage device.

8. The system as set forth in claim 1 wherein said memory data storage device is a flash memory card.

9. An electronic data storage system comprising:
    a memory data storage device capable of operating in a high power mode when data is being written to said memory data storage device and operating in a low power mode when inactive;
    a data acquisition device capable of receiving from one or more sources incoming data to be written to said memory data storage device;

a controller coupled to said data acquisition device capable of receiving said incoming data; and a first low power buffer coupled to said controller, wherein said controller stores said incoming data in said first low power buffer until a predetermined amount of incoming data has been accumulated in said first low power buffer and wherein said controller transfers said accumulated predetermined amount of incoming data to said memory data storage device in a single data transfer.

10. The electronic data storage system as set forth in claim 9 wherein said predetermined amount of incoming data is determined by a size of said predetermined amount of incoming data.

11. The electronic data storage system as set forth in claim 10 wherein said size of said predetermined amount of incoming data is five hundred twelve bytes of data.

12. The electronic data storage system as set forth in claim 9 wherein said predetermined amount of incoming data is determined by a selected time duration during which said incoming data has been accumulated.

13. The electronic data storage system as set forth in claim 9 wherein said controller transfers said accumulated predetermined amount of incoming data to said memory data storage device when said memory data storage device is in said high power mode.

14. The electronic data storage system as set forth in claim 9 further comprising a second low power buffer coupled to said controller capable of storing said incoming data when said accumulated predetermined amount of incoming data is being transferred from said first low power buffer to said memory data storage device.

15. The electronic data storage system as set forth in claim 9 wherein said memory data storage device is of a battery powered type having a relatively high power consumption when data is written to said memory data storage device.

16. The electronic data storage system as set forth in claim 9 wherein said memory data storage device is a flash memory card.

17. A method of reducing power consumption in an electronic data storage system comprising the steps of:

placing a memory data storage device in a low power mode of operation; and storing data in a first low power buffer when said memory data storage device is in a low power mode of operation until a predetermined amount of data has been stored in said first low power buffer; and placing said memory data storage device in a high power mode of operation; and transferring said predetermined amount of data to said memory data storage device when said memory data storage device is in a high power mode of operation.

18. A method as claimed in claim 17 together with the step of:

storing other data in a second low power buffer when said first low power buffer is transferring said predetermined amount of data to said memory data storage device; and transferring said other data to said first low power buffer when said first low power buffer has completed the transfer of said predetermined amount of data to said memory data storage device.

19. A method of reducing power consumption in a flash memory data storage system comprising the steps of:

placing a flash memory data card in a low power mode of operation; and storing data in a first low power buffer when said flash memory data card is in a low power mode of operation until a specified amount of data has been stored in said first low power buffer; and placing said flash memory data card in a high power mode of operation; and transferring said specified amount of data to said flash memory data card when said flash memory data card is in a high power mode of operation.

20. A method as claimed in claim 19 together with the step of:

storing other data in a second low power buffer when said first low power buffer is transferring said specified amount of data to said flash memory data card; and transferring said other data to said first low power buffer when said first low power buffer has completed the transfer of said specified amount of data to said flash memory data card.

\* \* \* \* \*